(12) United States Patent
Bihr et al.

(10) Patent No.: US 8,988,691 B2
(45) Date of Patent: Mar. 24, 2015

(54) POSITION-MEASURING DEVICE (71) Applicant: Dr. Johannes Heidenhain GmbH, Traunreut (DE)

(72) Inventors: Ralf Bihr, Traunstein (DE); Joerg Drescher, Samerberg (DE); Wolfgang Holzapfel, Obing (DE); Markus Meissner, Uebersee (DE); Bernhard Musch, Otterfing (DE); Bernhard Pletschacher, Chieming (DE)

(73) Assignee: Dr. Johannes Heidenhain GmbH, Traunreut (DE)

( * ) Notice: Subject to any disclaimer, the term of this patent is extended or adjusted under 35 U.S.C. 154(b) by 0 days.

(21) Appl. No.: 13/919,780

(22) Filed: Jun. 17, 2013

(65) Prior Publication Data
US 2013/0335750 A1 Dec. 19, 2013

Related U.S. Application Data (60) Provisional application No. 61/661,469, filed on Jun. 19, 2012.

(30) Foreign Application Priority Data

Jun. 19, 2012 (DE) .......................... 10 2012 210 309

(51) Int. Cl.
*G01B 11/14* (2006.01)
*G01D 5/38* (2006.01)
*G03F 7/20* (2006.01)

(52) U.S. Cl.
CPC *G01B 11/14* (2013.01); *G01D 5/38* (2013.01); *G03F 7/70775* (2013.01)
USPC .......................................................... 356/614

(58) Field of Classification Search
CPC ........ G01B 11/14; G01B 11/002; G01D 5/38; G03F 7/70775; G03F 7/70783
USPC ................. 356/614, 616; 250/237 G, 231.13, 250/231.14, 208.2
See application file for complete search history.

(56) References Cited

U.S. PATENT DOCUMENTS 4,595,991 A * 6/1986 Spies ................................ 33/12
6,198,534 B1 * 3/2001 Hofer et al. .................... 356/399

(Continued)

FOREIGN PATENT DOCUMENTS

EP 1 762 828 3/2007
EP 1 826 615 8/2007

OTHER PUBLICATIONS

European Search Report, issued in corresponding European Patent Application No. 13169683.3.

*Primary Examiner* — Sang Nguyen
(74) *Attorney, Agent, or Firm* — Kenyon & Kenyon LLP (57) ABSTRACT

A position-measuring device is used to detect the relative position of two machine components that are disposed in a manner allowing movement relative to each other at least along a first and a second main direction of motion in a displacement plane. The device includes at least one measuring standard, which is mounted on a first machine component. At least six scanning units are mounted on a second machine component, and are used for the optical scanning of the measuring standard in at least two measuring directions in the displacement plane. At least two scanning units are assigned to each measuring direction. The scanning units of each respective measuring direction in the displacement plane are disposed non-centrosymmetrically in relation to a center of the second machine component.

19 Claims, 5 Drawing Sheets

(56) References Cited

U.S. PATENT DOCUMENTS

| | | | |
|---|---|---|---|
| 7,542,863 B2* | 6/2009 | Drescher et al. | 702/94 |
| 7,573,581 B2 | 8/2009 | Holzapfel | |
| 7,602,489 B2 | 10/2009 | Van der Pasch et al. | |
| 7,839,485 B2* | 11/2010 | Shibazaki | 355/53 |
| 2006/0227309 A1 | 10/2006 | Loopstra et al. | |
| 2007/0195296 A1 | 8/2007 | Van der Pasch et al. | |
| 2009/0190110 A1 | 7/2009 | Shibazaki | |
| 2010/0011603 A1* | 1/2010 | Finkler | 33/706 |
| 2011/0261422 A1* | 10/2011 | Braasch et al. | 358/488 |
| 2011/0286004 A1* | 11/2011 | Holzapfel et al. | 356/499 |
| 2011/0317142 A1 | 12/2011 | Cox et al. | |
| 2013/0208287 A1* | 8/2013 | Holzapfel et al. | 356/616 |

\* cited by examiner

POSITION-MEASURING DEVICE

CROSS-REFERENCE TO RELATED APPLICATIONS

The present application claims priority to Application No. 10 2012 210 309.0, filed in the Federal Republic of Germany on Jun. 19, 2012, which is expressly incorporated herein in its entirety by reference thereto.

The present application also claims the benefit of U.S. Provisional Application Ser. No. 61/661,469, filed on Jun. 19, 2012, which is expressly incorporated herein in its entirety by reference thereto.

FIELD OF THE INVENTION

The present invention relates to a position-measuring device.

BACKGROUND INFORMATION

In order to measure, with extreme precision, the position of machine components movable relative to each other, preferably optical position-measuring devices are used. They include one or more optical scanning units that are connected to a first machine component, as well as one or more measuring standards that are connected to a second machine component, the second machine component being movable relative to the first machine component. Displacement-dependent position signals, and consequently the relative position of the machine components, are able to be determined by the optical scanning of the measuring standard(s) with the aid of the scanning units. The measuring standards may be formed as one-dimensional scales or else as two-dimensional grid plates. In certain configurations, the scanning units of the position-measuring device are mounted on a movable machine component such as a table, for example, which must be positioned under a processing tool, the workpiece to be processed being disposed on the table. The intention is for the workpiece to be displaceable via the table in a displacement plane (XY plane) along two main axes of motion X, Y, while the other degrees of freedom (displacement along a Z-axis which is oriented perpendicularly to the XY plane, rotations about the X, Y and Z axes) are to be fixed or only slightly modulated. In a plane parallel to the displacement plane, one or more two-dimensional grid plates of the position-measuring device are disposed on the machine, against which the scanning units are able to measure. The grid plates are placed in stationary fashion about the specific processing tool.

The main objective of such a position-measuring device is to determine the position and location of the machine component at least with respect to the displacement degrees of freedom x, y along the main axes of motion X, Y, as well as with respect to the torsional degree of freedom $R_Z$ about the Z-axis. Hereinafter, the term 3-DOF measurement (DOF=Degree Of Freedom) is used in this regard. Moreover, for high-precision applications, it may be necessary to measure all six degrees of freedom of the specific machine component. They would also be the displacement degree of freedom z along the Z-axis, as well as the torsional degrees of freedom $R_Y$, $R_X$ about the Y-axis and X-axis, respectively. In this case, one refers to a 6-DOF measurement.

Such a system, which is used in the semiconductor industry for positioning a wafer (workpiece) under an exposure or inspection unit (processing tool), is described, for example, in U.S. Patent Application Publication No. 2007/0195296. The table T in a machine of this type is equipped with a position-measuring device having four combined scanning units E1 to E4 according to U.S. Pat. No. 7,573,581, as illustrated schematically in FIG. 1 of the present application. Each scanning unit E1 to E4 generates scanning signals or measured position values that contain two directional components of the scanning-unit position relative to the scanned grid plate:

Along a predefined direction in the plane of the grid plates; the measured position value in this direction is denoted hereinafter by $Y^{(enc)}$.

Along a distance perpendicular to the grid plate; this measured position value is denoted hereinafter by Z, the corresponding distance measurement as Z-measurement.

Therefore, a scanning unit according to U.S. Pat. No. 7,573,581 may be viewed as a combination of a scanning unit having a measuring direction in displacement plane XY, and a scanning unit having a measuring direction Z perpendicular to displacement plane XY.

Figure 1:
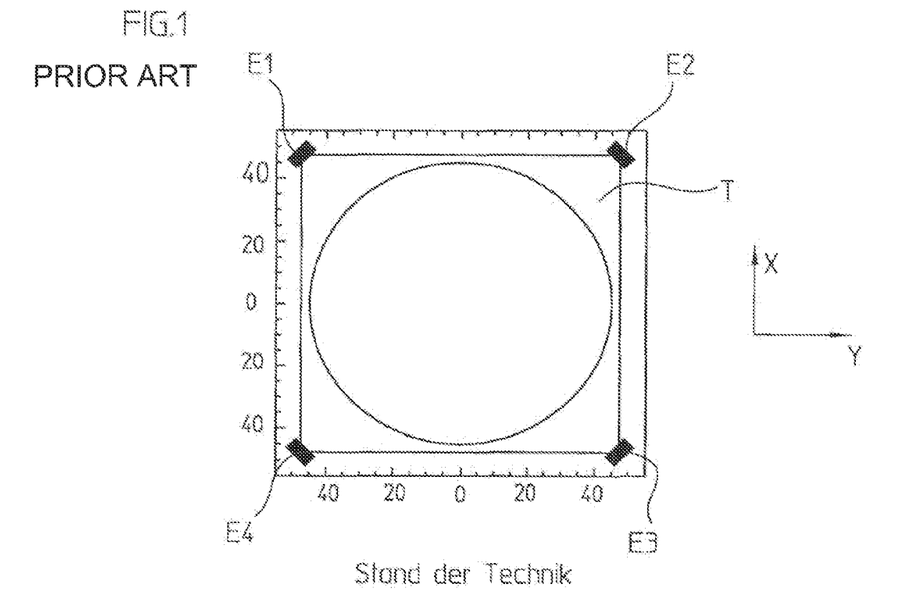
FIG. 1 schematically illustrates a conventional system.

Scanning units E1 to E4 are mounted at the four corners of table T and, as illustrated in FIG. 1, are oriented at an angle relative to the two main axes of motion X, Y. Depending on the orientation, the scanning units therefore ascertain either measured position values $Y^{(enc)}=(X+Y)/\sqrt{2}$ or measured position values $Y^{(enc)}=(X-Y)/\sqrt{2}$. Moreover, each scanning unit E1 to E4 supplies information or measured position values with regard to its distance along the Z-axis to the grid plate.

Figure 2:
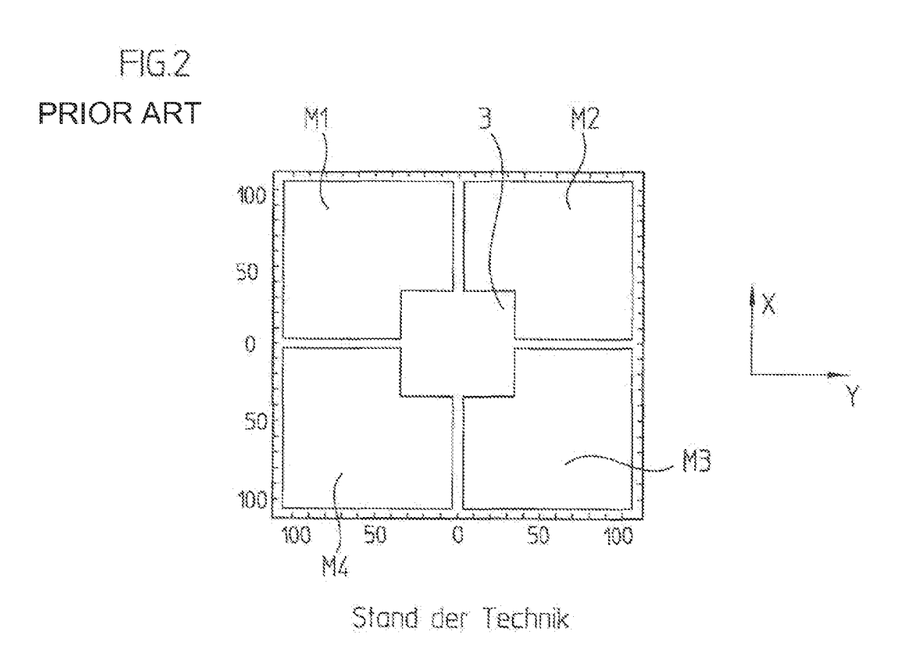
FIG. 2 also schematically illustrates a conventional system.

In this system, scanning units E1 to E4 take measurements relative to four mutually adjoining grid plates M1 to M4 placed in a square, as illustrated in FIG. 2. Incidentally, the units of the axis legends in FIGS. 1 and 2 are selected arbitrarily. In the center of the grid-plate configuration, a larger area 3 is left open. The processing tool, e.g., the exposure or inspection unit, is located here. During machine operation, one of the four scanning units E1 to E4 may be located temporarily underneath cut-out area 3, and during this time, provide no measured values. Nevertheless, the machine position is able to be determined precisely in this case as well, since three scanning units engaged with grid plates M1 to M4 are sufficient for determining the six degrees of freedom of table T.

The precision of the particular machine is critically impaired, for example, by the following disturbance factors:

Distortions of grid plates M1 to M4 (static or changing slowly during machine operation, what is referred to as "drift," often caused by temperature fluctuations)

Natural oscillations and vibrations of table T or of the machine component upon which the workpiece is located.

The larger the workpiece, the more important the above-mentioned disturbance factors become, because for larger machine components and grid plates, it is more difficult to suppress vibrations and deformations by stiffening their construction. However, if measurement data concerning the scale deformations and the present state of excitation of the vibrations of the machine component is available, suitable measures may be taken for compensation or attenuation.

Such vibrations of the machine component represent oscillating deformations of the machine component, e.g., the table. They lead to a deflection of scanning units E1 to E4 disposed on it relative to their assumed position in the (hypothetically) rigid machine component. Consequently, the position of the machine component, which, without taking vibrations into account, is obtained directly from the measured values of scanning units E1 to E4, does not agree with the actual position of the machine component. Moreover, the position of the processing tool calculated from the machine-component position, thus, for example, the position of the exposure or inspection unit relative to the workpiece, i.e., the wafer, is not determined exactly, because the workpiece vibrates together with the machine component and deforms accordingly.

One possibility for detecting vibrations of machine components is based on the analysis of the history of the scanning-unit measured values over time or the corresponding analysis in the frequency space, and of the forces which were exerted on the machine component. In this regard, reference is made, for example, to U.S. Patent Application Publication No. 2011/0317142. The information thus obtained about the deformation of the machine component caused by a vibrational mode can be fed into the control of the actuators such that the error in the position of the processing tool relative to the workpiece caused by vibrations is sharply reduced.

However, such a vibration detection and compensation based exclusively on an analysis of the scanning-unit measured values over time has a number of disadvantages.

For example, the vibrations of the machine component are not detected via a measuring system during machine operation, but rather are estimated via a dynamic physical model that describes the effect of external forces on the machine component. The physical model may be ascertained from theoretical calculations or mechanical measurements. Small deviations of this model from the real mechanical behavior, as well as force attacks on the machine component not detected therefore contribute directly to a positioning error of the processing tool relative to the workpiece. The deviations of the model predictions from the real behavior cannot be detected during machine operation.

Moreover, the splitting of the measured values (and forces), described in U.S. Patent Application Publication No. 2011/0317142, into a position signal and a vibration signal is based on filters which process the variation in these quantities with time. For example, the filters are applied in the frequency space as bandpass or notch filters. In order to carry out such a frequency filtering, the time characteristic of the signal must be known over a time span on the order of one period of the vibration oscillation. Consequently, signal processing of this kind leads inevitably to a certain lag or to a latency of the control system, at least within the frequency bands which are assigned to the vibrations. Therefore, especially in the case of rapid acceleration processes or when attempting to actively dampen oscillations within a brief time, it must be expected that a sluggish control system is a disadvantage.

SUMMARY

Example embodiments of the present invention provide a position-measuring device which, in addition to at least a 3-DOF determination of the position of a machine component, also permits the most instantaneous possible determination of the deformations of the machine component caused by vibrations.

A position-measuring device according to example embodiments of the present invention is used to detect the relative position of two machine components that are disposed in a manner allowing movement relative to each other at least along a first main direction of motion and a second main direction of motion in a displacement plane. The device includes at least one measuring standard, which is mounted on a first machine component, and at least six scanning units that are mounted on the second machine component and are used for the optical scanning of the measuring standard in at least two measuring directions in the displacement plane. In this context, at least two scanning units are assigned to each measuring direction. Furthermore, the scanning units of each respective measuring direction in the displacement plane are disposed non-centrosymmetrically in relation to a center of the second machine component.

It is also possible to provide at least three further scanning units that are adapted to detect the relative position of the two machine components along a further direction, this direction being oriented perpendicularly to the displacement plane.

For example, the scanning units having measuring directions in common in the displacement plane are not disposed on a straight connecting line in common.

It may be provided that a Cartesian coordinate system having four quadrants is formed by two axes which are aligned perpendicularly to one another in the displacement plane and which intersect in the center of the second machine component, and that at least two scanning units each, having in each instance the same measuring direction, are disposed in at least two quadrants.

It may also be provided that a Cartesian coordinate system having four quadrants is formed by two axes which are aligned perpendicularly to one another in the displacement plane and which intersect in the center of the second machine component, and that at least two scanning units each, having in each instance the same measuring direction, are disposed in at least three quadrants.

Furthermore, it may also be provided that a Cartesian coordinate system having four quadrants is formed by two axes which are aligned perpendicularly to one another in the displacement plane and which intersect in the center of the second machine component, and that at least two scanning units each, having in each instance the same measuring direction, are disposed in all four quadrants.

Moreover, in this regard, it is possible that in each case, the scanning units which are disposed in diagonally opposite quadrants all have the same measuring direction.

It may also be provided that in at least three quadrants, a further scanning unit is disposed which is designed to detect the relative position of the two machine components along a further direction, this direction being oriented perpendicularly to the displacement plane.

In addition, it is possible that at least one scanning unit for a measuring direction in the displacement plane is integrated, together with a scanning unit for a measuring direction perpendicular to the displacement plane, in one combined scanning unit.

The position-measuring device may thus be used to detect several degrees of freedom of a movably mounted machine component and to detect vibrations of the machine component.

In addition, the position-measuring device may be used to detect errors of the measuring standard employed.

The position-measuring device thus permits an instantaneous co-detection of vibrations of a machine component. In so doing, in contrast to conventional arrangements, for example, no measured-value analysis over a longer period of time is necessary. Unnecessary latency periods or sluggish reactions in the machine control system are able to be avoided, since information concerning the deflections of the machine component caused by vibrations is available without delay.

It should be understood that the deformation of the machine component due to vibrations may be measured directly at the measuring points of the scanning units of the position-measuring device. Therefore, in determining the instantaneous deformation, it is no longer imperative to resort to the prediction based on a complicated and possibly inaccessible dynamic model of the machine component.

The measures described herein also provide a possibility to expand the maximum travel range of the overall system without an enlargement of the measuring standards utilized being necessary to that end. Thus, the range within which the machine component is able to be moved and positioned is enlarged.

Moreover, the measured values additionally obtained may be used to calibrate the system, for example, to detect possible deformations or faults of the grid plates.

Further features and aspects of example embodiments of the present invention are described in more detail below with reference to the appended Figures.

DETAILED DESCRIPTION

Before describing the position-measuring devices schematically illustrated in FIGS. 6 to 8, various theoretical observations are discussed below.

For example, each vibrational mode causes an oscillating deformation of the corresponding machine component in a form characteristic for the mode. FIGS. 4a to 4e show, for example, the five lowest-frequency vibrational modes of a homogeneous quadratically-formed machine component, a flat table being provided as machine component, upon which the workpiece is placed. FIGS. 4a to 4e each show the height profile of the machine component, that is, its Z-deflection. Besides the contour lines, in these Figures, arrows are marked in which point in the direction of the specific gradient. The individual scanning units of a position-measuring device which are mounted at various points of the machine component are deflected by these oscillating deformations. If the modes of the machine component are known, then the measured position values are influenced by deformations of the machine component in known manner as a function of the position of the scanning units.

Figure 3:
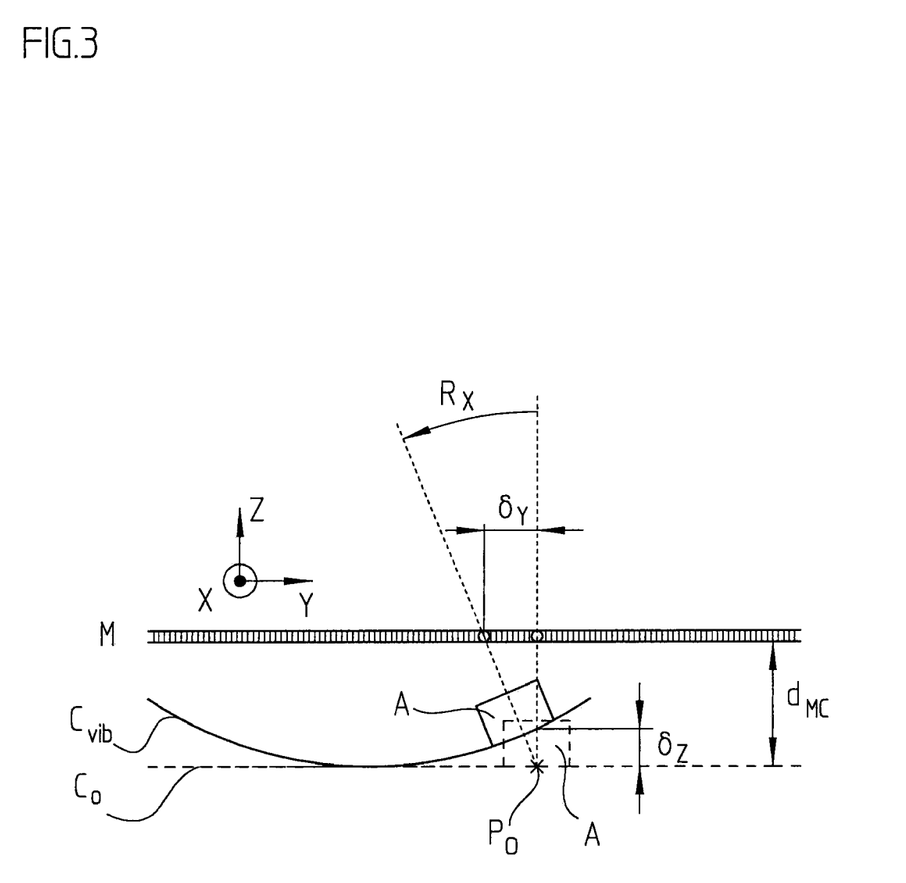
FIG. 3 schematically illustrates the effect of vibrations on the measured values of a position-measuring device.

FIG. 3 shows the mechanism for small deformations of the machine component, i.e., of a table in leading order. Reference character M denotes the measuring standard, and reference character $C_0$ denotes the table surface in a neutral position, which is at distance $d_{MC}$ from measuring standard M. In this plane, a scanning unit A indicated by a dotted line is located at point $P_0$. Scanning unit A does not necessarily have to be situated above table surface $C_0$. Rather, it may also be recessed downward relative to table surface $C_0$. Scanning unit A measures against measuring standard M, as indicated by the perpendicularly-extending dotted line.

During machine operation, vibrations bring about oscillating distortions of the table plane, that is, of the table surface. FIG. 3 shows, for example, a distorted table surface, denoted by $C_{vib}$. Scanning unit A is also displaced and tilted by the vibration occurring. Displaced scanning unit A is depicted with solid lines. For a flat machine component, vibrational modes in leading order may be considered as oscillating changes of the height profile of the machine-component surface. The vibrations raise or lower scanning unit A along the Z-axis by the amount $\delta Z$. Moreover, scanning unit A is tilted by an angle about the X-axis, which is denoted by $R_x$ in FIG. 3. Depending on the measuring direction and construction of scanning unit A, deviations $\delta Z$ and $R_x$ relative to the neutral position have an effect on the measured position values generated by scanning unit A. If the properties of scanning unit A in response to the resulting tilting and displacement are known, then the contributions, caused by the vibrational modes, to the measured position values may be calculated from the instantaneous deflection of the machine component. For example, if scanning unit A shown in FIG. 3 is a scanning unit having a measuring direction along the Y-axis and if the neutral point of rotation of scanning unit A is located on measuring standard M, then the acquired measured position value along measuring direction Y changes by the amount $\delta Y \approx d_{MC} \cdot R_X$ due to the deformation of the machine component. In this context, the neutral point of rotation should be understood be that point about which a possible tilting of scanning unit A does not bring about any change in the measured position values generated. In this case, it is also possible to dispense with the approximation in leading order. It may be that the correlation between the deflection of the machine component and the measured position values then becomes more complex. However, it can continue to be calculated within the framework of a geometric model.

If only scanning units having measuring directions in the displacement plane are provided, then as a consequence, tiltings of the machine component about the X-axis or Y-axis as well as the Z-position of the machine component cannot be measured or in linear order cannot be differentiated from the displacement degrees of freedom x, y in the displacement plane. Thus, for the 3-DOF determination of position and orientation of the machine component, at least three suitable measured position values of the scanning units must be available, so that coordinates X, Y as well as angle of rotation $R_Z$ of the machine component are able to be determined from them. All further measured position values available may already be used for detecting vibrations. Therefore, at a maximum, the 3 degrees of freedom x, y, $R_Z$ as well as N vibrational modes are able to be detected by an overall system that includes 3+N scanning units having measuring directions in the X,Y-plane.

If at least three scanning units having a measuring direction Z are also available, then a 6-DOF determination of the machine component may be performed. Thus, in this case, at least 6 suitable measured position values are needed in order to determine coordinates X, Y, Z as well as rotations $R_X$, $R_Y$ and $R_Z$ of the machine component from them. All measured position values available over and above that may be used for detecting vibrations. Consequently, with a system for the 6-DOF determination which has a total of 6+N scanning units, in addition to the 6 degrees of freedom of the (rigid) machine component, a maximum of N vibrational modes may also be detected.

For the evaluation of the measured position values generated, the most important vibrational modes of the machine component must have been determined in advance from a modal analysis, e.g., with the aid of a computer simulation or a suitable measurement. For the evaluation, a system of equations is provided, for example, which describes the measured position values to be anticipated for a given configuration of scanning units on the machine component. Each equation conveys a measured position value as a function of the present vibratory deflections and the present machine-component position.

Each vibrational mode ascertained by the modal analysis represents an additional degree of freedom. Formally, therefore, using the position-measuring device having a plurality of scanning units, at least a 3+N DOF measurement is thus performed (assuming restriction to scanning units having measuring directions only in the XY-displacement plane), or a 6+N DOF measurement is performed where, in addition to the six degrees of freedom of the rigid body, N additional vibratory degrees of freedom are also measured. Thus, the present deformation of the machine component may be detected virtually instantaneously, provided it is made up of the ascertained vibrational modes and further—as a rule higher—modes are negligible.

Optionally, the analysis method described may be combined with an analysis of the time characteristic of the measured position values and forces on the machine component, e.g., using approaches as described in U.S. Patent Application Publication No. 2011/0317142.

Thus, the following additional possibilities may be provided:
  If necessary, more degrees of freedom may be differentiated than there are measured position values of the scanning units available, e.g., by splitting into different natural frequencies.
  To reduce instantaneous fluctuations (e.g., noise), information from previous measurements may be incorporated into the final result.
  It is possible to determine the present amplitude and phase of each detected mode. The time derivative of the deflections may be used for that purpose. In this case, at least one set of measured position values from an earlier measuring instant is also considered.

With the aid of the amplitude and phase information, the acceleration of the machine component and/or the control of suitable actuators may be selectively modulated, so that vibrations of the machine component are actively damped. Depending on the machine, it may also be possible to reduce the effects of vibrations on the workpiece during the processing operation by compensating tracking of the machine-component position or workpiece position.

If no significant vibrations of the machine component occur, only six measured position values are needed to determine the six degrees of freedom of the rigid body. In this case, the ("redundant") measured position values available over and above that may be used, for example, to calibrate the machine. For example, distortions of the measuring standards formed as grid plates may be detected. Such a calibration may be accomplished by suitable selection of the scanning values independently of the known vibrational modes, e.g., by a scanning in phase-locked fashion with respect to the known vibrational frequency or by averaging over at least one period of vibration.

In summary, in order to determine and to compensate as instantaneously as possible for the deformations of a machine component caused by vibrations, one therefore proceeds in the following manner using the position-measuring device.

In the design phase of the machine, a modal analysis of the relevant machine component is performed, e.g., via a finite-element simulation or suitable measurements to ascertain the N most important vibrational modes.

During the actual operation of the machine, a measurement of the machine-component position and the machine-component vibrations is performed in the form of an acquisition of 3+N or 6+N degrees of freedom using the position-measuring device.

It is thus possible, for example, to exert vibration-damping forces on the machine component with the aid of machine-component accelerations coupled into the motor control or by the driving of separate actuators.

It is further possible to track or reposition the machine component or the processing tool to compensate for the remaining vibrations.

The configuration of the scanning units in the position-measuring device should be favorably selected to be as sensitive as possible with respect to the modes to be detected and to ensure a large travel range. To keep the complexity and the costs low, as few scanning units as possible should be used in the position-measuring device. In general, however, at least three important vibrational modes are to be detectable via the position-measuring device.

Figure 5:
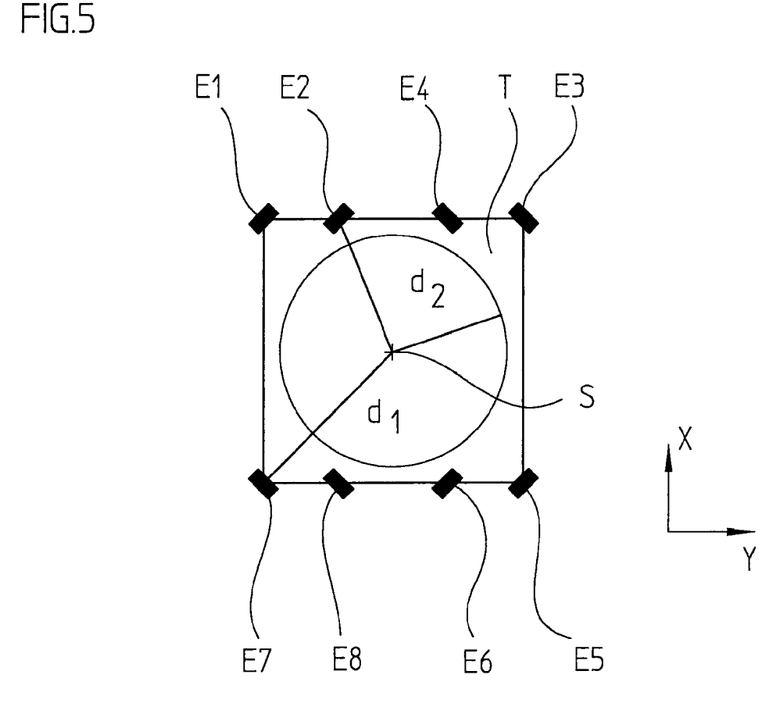
FIG. 5 schematically illustrate an arrangement of scanning units in a position-measuring device.

In the following, three exemplary embodiments of a position-measuring device are described with reference to FIGS. 6 to 8. Referring to FIG. 5, a configuration of eight scanning units E1 to E8 in a position-measuring device is described which, although it represents an improvement compared to conventional arrangements, is still not optimally suitable for the detection of the machine-component vibrations striven for.

As explained above, the corresponding position-measuring device may be used in a machine for manufacturing semiconductors. It may be used to detect the relative position of two objects or machine components that are disposed in a manner allowing movement relative to each other along a first and a second main axis of motion Y, X. For example, the respective machine components may be a first stationary machine component and a machine component such as a table T, for example, movable relative to it. Table T is able to be positioned along first and second main axes of motion Y, X oriented orthogonally relative to each other. On table T, a workpiece, e.g., a wafer, may be disposed that is positioned relative to a stationary processing tool.

Provided on the stationary machine component in the example are one or more two-dimensional measuring standards in the form of grid plates having cross gratings disposed on them, as illustrated in FIG. 2, for example. On the movable machine component, that is, on table T, a plurality of scanning heads E1 to E8 are provided for the optical scanning of the measuring standard(s). U.S. Pat. No. 7,573,581, which is expressly incorporated herein in its entirety by reference thereto describes details of a possible optical scanning and a particular embodiment of the scanning principle.

Table T is situated in the displacement plane, also denoted hereinafter as XY-plane. Both in FIG. 5 and in the following Figures, table T is schematically illustrated as rectangular. A circular workpiece may in each instance be placed in center S of table T. It should be understood, table T may also have alternative geometries.

In the example illustrated in FIG. 5, the position-measuring device includes a total of eight scanning units E1 to E8 disposed on table T. In this context, four scanning units E1, E3, E5 and E7 are located in the corners of a rectangle. The four scanning units E1, E3, E5, E7 are disposed centrosymmetrically relative to a center S of table T in one placement plane. All four scanning units E1, E3, E5 and E7 have the same first distance $d_1$ to center S.

Scanning units E1 and E5 or E3 and E7 at the respective opposite corners of rectangular table T are aligned in parallel. This means that the gratings provided in them for the optical scanning are oriented parallel to each other, so that their respective measuring directions are identical. Consequently, in two opposite corners, a measured position value $Y^{(enc)}=(X+Y)/\sqrt{2}$ is measured, and in the two other opposite corners, a measured position value $Y^{(enc)}=(X-Y)/\sqrt{2}$ is measured.

For each of the four scanning units E1, E3, E5 and E7, in the example illustrated in FIG. 5, a further scanning unit E2, E4, E6 and E8 with measuring direction oriented in parallel is provided on table T in the placement plane of the first four scanning units E1, E3, E5 and E7. As illustrated in FIG. 5, the Y-coordinates of these four further scanning units E2, E4, E6 and E8 are each shifted toward center S of table T relative to scanning units E1, E3, E5 and E7 in the corners. Consequently, the four further scanning units E2, E4, E6 and E8 have second distances $d_2$ to center S which are smaller than first distances $d_1$ of scanning units E1, E3, E5 and E7 located in the corners.

The symmetrical properties of the machine component, i.e., of table T are transferred to the form of the natural vibrations. As illustrated in FIGS. 4a to 4e, the point symmetry relative to the table center of mass, i.e., center S represents an especially important symmetry. If the mechanical construction of the table satisfies point symmetry (approximately), then the eigenmodes under point reflection are also (approximately) even (i.e., unaltered) or odd (i.e., equal except for the operational sign).

If groups of scanning units are disposed symmetrically relative to each other in accordance with the table symmetry mentioned, then the measured position values generated by them with respect to the even (or odd) vibrational modes under symmetry transformation are redundant, because the signals of the mutually symmetric scanning-unit groups caused by these vibrations are equal (i.e., equal except for the operational sign). This redundancy is undesirable, because it reduces the amount of independent information, ascertainable by the scanning units provided, about the present state of excitation of the table.

Figure 4A:
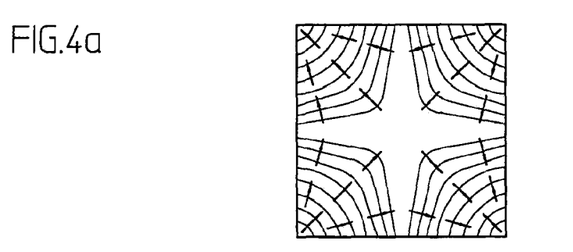
FIGS. 4a to 4e schematically illustrate, in each case, a vibrational mode of a square table.
Figure 4B:
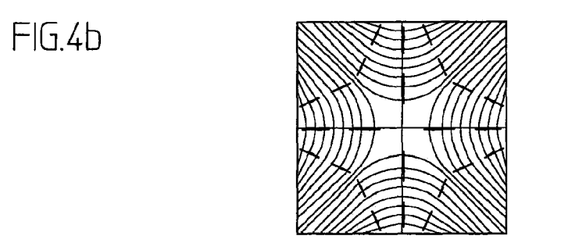
Figure 4C:
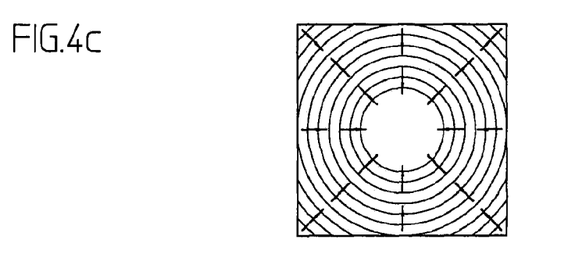
Figure 4D:
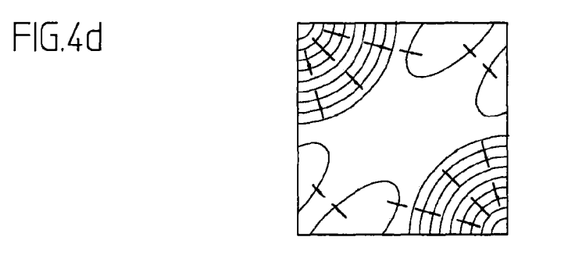
Figure 4E:
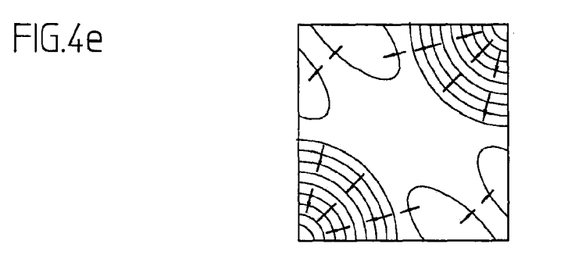

In this connection, the three vibrational modes illustrated in FIGS. 4a to 4c must be considered in particular. Under point symmetry, these three vibrational modes are even. Therefore, in the position-measuring device, it is necessary to position the scanning units such that a centrosymmetric arrangement of the necessary scanning units is avoided in order to be sensitive with respect to each of these first three vibrational modes.

The scanning-unit configuration according to the example illustrated in FIG. 5 is highly symmetrical. A typical case, in which two side-by-side scanning units E1 to E8 are not located under one of the several measuring standards, but rather, are located, for example, in the free central area having the processing tool is discussed below.

For example, they may be scanning units E7 and E8 from the scanning-unit configuration illustrated in FIG. 5. The remaining active scanning units E1 to E6 then furnish the following information.

Via the three scanning units E1, E3 and E5 in the corners, there is already sufficient information available to ascertain the 6 rigid-body degrees of freedom of table T. The remaining three scanning units E2, E4, E6 furnish additional information for the vibration detection. However, scanning-unit pairs E1, E2 as well as E5, E6 are disposed centrosymmetrically relative to each other, that is, the information supplied by these scanning units E1, E2 and E5, E6 is at least partially redundant. That is why the configuration of eight scanning units E1 to E8 illustrated in FIG. 5 is not yet ideal to obtain the maximum possible amount of information about vibrations that may be present.

A configuration of scanning units optimized compared to FIG. 5, and therefore a first exemplary embodiment of the position-measuring device, is explained below with reference to FIG. 6.

Figure 6:
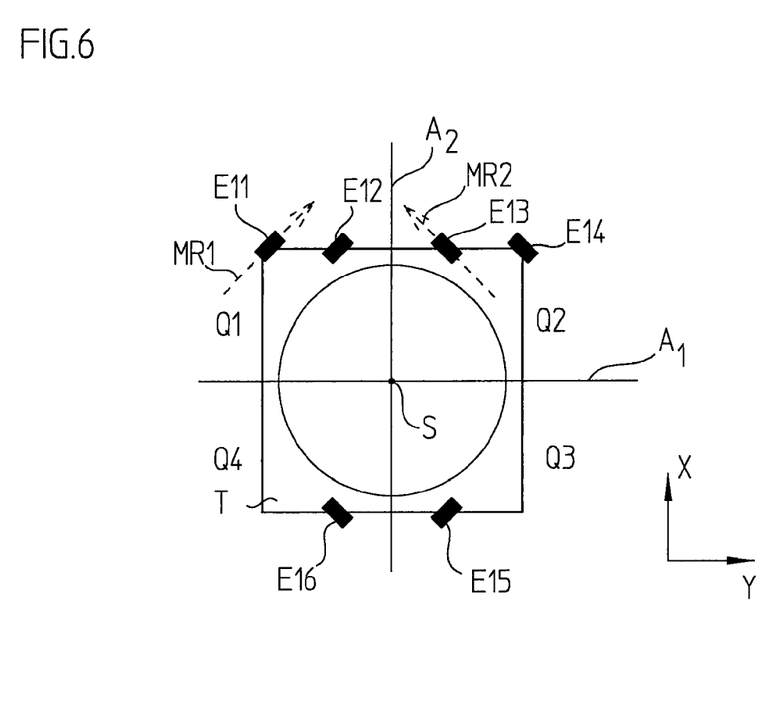
FIG. 6 schematically illustrates an arrangement of scanning units in a position-measuring device according to an example embodiment of the present invention.

FIG. 6 illustrates one part of the first exemplary embodiment of the position-measuring device, namely, the machine component in the form of movable table T, on which six scanning units E11 to E16 are disposed in a defined manner. Not illustrated in FIG. 6 is the machine component which is stationary relative to it, and on which at least one measuring standard is disposed. Table T is mounted in a manner allowing it to shift in a displacement plane along the two main directions of motion Y, X. As illustrated in FIG. 2, a plurality of grid plates M1 to M4 may be provided as a measuring standard, each including two-dimensional cross gratings that are able to be scanned by scanning units E11 to E16. In each case, an optical scanning of the measuring standard along a defined measuring direction MR1, MR2 is performed by scanning units E11 to E16. Accordingly, one specific measuring direction MR1, MR2 is to be assigned to each scanning unit E11 to E16. In this context, measuring direction MR1, MR2 should be understood as a defined direction in the three-dimensional space. At the instant of the measurement, scanning unit E11 to E16 supplies a numerical value, referred to as the position value. The position value corresponds to the coordinate of scanning unit E11 to E16 relative to a Cartesian coordinate axis, whose orientation in space is given by measuring direction MR1, MR2. In this context, the Cartesian coordinate axes do not have to coincide with main directions of motion Y, X indicated above.

In the present exemplary embodiment, measuring directions MR1, MR2 of scanning units E11 to E16 in each case extend specifically along their longitudinal axis. However, in principle, this is not necessary, but rather, is a function of the specific optical scanning principle. With regard to the configuration of the scanning units, reference is made, for instance, to U.S. Pat. No. 7,573,581, which is expressly incorporated herein in its entirety by reference thereto.

In the first exemplary embodiment of the position-measuring device, scanning units E11 to E16 are used for the optical scanning of the at least one measuring standard in two measuring directions MR1, MR2. Thus, as illustrated in FIG. 6, the three scanning units E11, E12, E15 are assigned a first measuring direction MR1 that is tilted by +45° relative to first main direction of motion Y. The three scanning units E13, E14 and E16 are assigned second measuring direction MR2 which is tilted by −45° relative to first main direction of motion Y. While in the present exemplary embodiment, in each case three scanning units E11, E12, E15 and E13, E14, E16, respectively, are assigned to each measuring direction MR1, MR2, in principle, it is at least necessary in the position-measuring device to assign at least two scanning units to each measuring direction.

In order to avoid the redundancy, discussed above, when detecting the first three vibrational modes, it is provided that scanning units E11, E12, E15 or E13, E14, E16 of a respective measuring direction MR1 or MR2 in the displacement plane are disposed non-centrosymmetrically relative to a center S of table T, i.e., of the corresponding machine component. Thus, for instance, in the first exemplary embodiment, there is no point symmetry with regard to the placement of scanning units E11, E12, E15 (first measuring direction MR1) relative to center S. Scanning units E12 and E15 have different distances to center S. The straight connecting line between scanning units E11 and E15 does not pass through center S. The further scanning units E13, E14, E16 for second measuring direction MR2 are positioned in analogous manner.

If the position-measuring device is used in a machine for manufacturing semiconductors, and the machine component having the scanning units is therefore the table having the workpiece, then as a rule, the scanning units may only be placed near the table edges. The workpiece is usually placed in the center of the table. For vibration detection, configurations may be provided in which the scanning units of one measuring direction in common do not all lie on one edge of the table. In this connection, reference is made, for example, to the vibrational mode illustrated in FIG. 4a. If scanning units having the same measuring direction are disposed on one straight edge of the table, then all measured position values of the scanning units change by approximately the same amount. Consequently, this change cannot be distinguished from a position change of the table (or its tilting about an axis in the displacement plane). Therefore, it may possibly be of advantage in the position-measuring device that the scanning units of one measuring direction are not all located on one straight line in common.

In the first exemplary embodiment illustrated, in each case three scanning units E11, E12, E15 and E13, E14, E16, respectively, are provided per measuring direction MR1, MR2. Scanning units E11, E12, E15 or E13, E14, E16 provided per measuring direction MR1, MR2 are arranged such that scanning units E11 to E16 having a measuring direction MR1, MR2 in common in the displacement plane are not disposed on one straight connecting line in common.

Also illustrated in FIG. 6 are two axes $A_1$, $A_2$ in the displacement plane that are perpendicular to each other and intersect in center S of table T. Via these axes $A_1$, $A_2$, a Cartesian coordinate system is thus formed, with origin in center S and four quadrants Q1 to Q4. In the first exemplary embodiment of the position-measuring device, two scanning units each, E11, E12 or E13, E14, are disposed in the two quadrants Q1, Q2. Scanning units E11, E12 or E13, E14 disposed in a quadrant Q1 or Q2 each have the same measuring direction MR1, MR2. If scanning units E11 to E16 are disposed in diagonally opposite quadrants Q1, Q3 and Q2, Q4, respectively, it may further be advantageous that in each case they have the same measuring direction MR1, MR2. That means, for example, that scanning units E11, E12 and E15 in diagonally opposite quadrants Q1, Q3 have the same measuring direction MR1. Analogously, scanning units E13, E14 and E16 in corresponding quadrants Q2, Q4 have the same measuring direction MR2.

Such an arrangement is considered to be advantageous based on the following considerations.

In order to be able to detect rotations of table T as accurately as possible, distances of sufficient size must be available between scanning units E11 to E16. It is therefore preferred if not all scanning units E11 to E16 are located in one and the same quadrant Q1 to Q4 of the coordinate system defined by axes $A_1$, $A_2$. At the same time, despite grid plates of limited size, the intention is to permit the largest possible travel range in which a determination of the position of table T is possible. It is possible to meet both these demands by, as outlined above, in each case requiring at least two scanning units E11 to E16 of the same measuring direction MR1, MR2 in two different quadrants Q1 to Q4 of the coordinate system mentioned. The two scanning units E11, E12 and E13, E14, respectively, of the same measuring direction MR1 or MR2 ensure a position determination even if one of the two scanning units is not located under a grid plate.

In addition to provided scanning units E11 to E16 having measuring directions MR1, MR2 in the displacement plane of table T, in the position-measuring device, it may be provided to dispose at least three further scanning units on table T which make it possible to detect the relative position of table T along a further axis. Usually, this is the Z-axis, which is oriented perpendicularly to the displacement plane and along which a table movement may result during machine operation. In this manner, all 6 translation and rotation degrees of freedom of the table are able to be detected. Preferably, these additional scanning units are disposed so that such a scanning unit is placed in at least three of quadrants Q1 to Q4 illustrated in FIG. 6.

In addition, it is considered particularly advantageous in this connection if scanning units E11 to E16 having measuring directions MR1, MR2 in the displacement plane are integrated with the additional scanning units for measuring directions perpendicular to the displacement plane, in one combined scanning unit.

Figure 7:
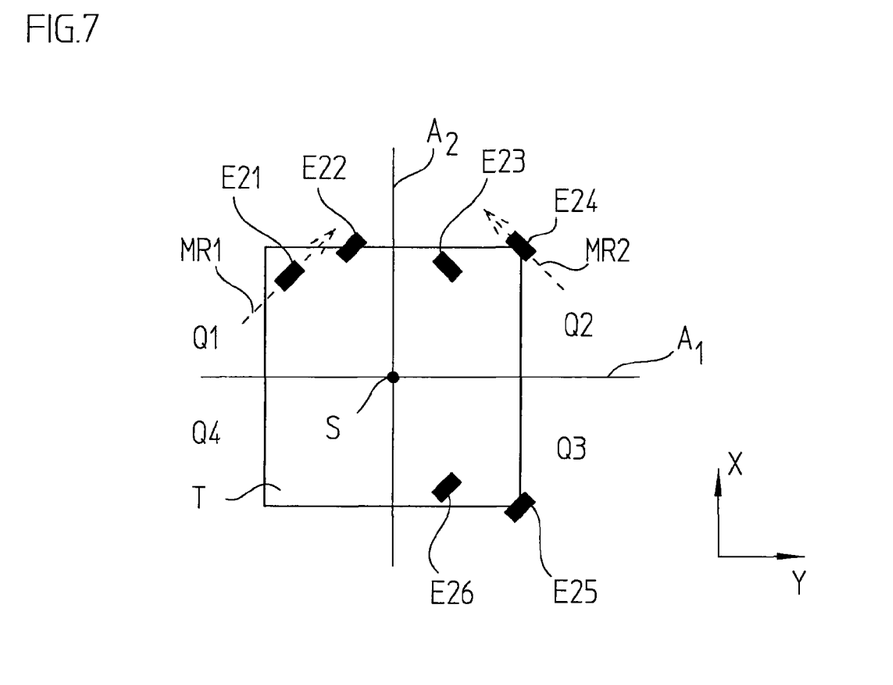
FIG. 7 schematically illustrates an arrangement of scanning units in a position-measuring device according to an example embodiment of the present invention.
Figure 8:
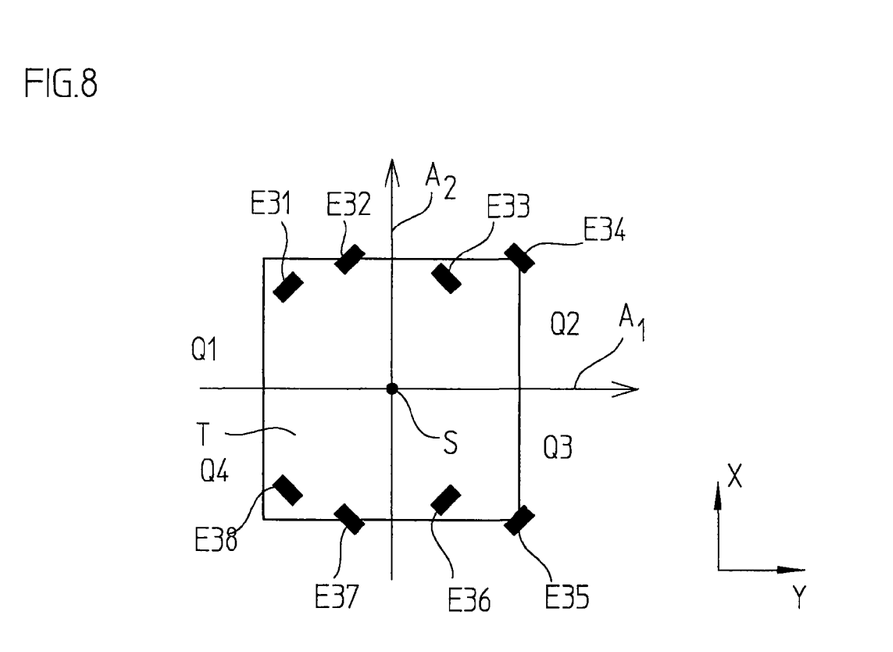
FIG. 8 schematically illustrates an arrangement of scanning units in a position-measuring device according to an example embodiment of the present invention.

Another exemplary embodiment of the position-measuring device is illustrated in FIG. 7, analogous to the representation in FIG. 6. In the following, generally only the significant differences relative to the first exemplary embodiment are explained.

Six scanning units E21 to E26 are again provided, which are disposed in defined manner on table T, i.e., the corresponding machine component.

In each case two scanning units E21/E22, E23/E24 and E25/E26 of the same measuring direction MR1, MR2 are placed in at least three quadrants Q1 to Q3 of the coordinate system mentioned. An advantage of this arrangement is that all scanning units E21 to E26 are able to be disposed relatively far away from center S of the table. This permits particularly good vibration detection, while at the same time, a large travel path of table T remains ensured.

Preferably, scanning units E21 to E26 having the same measuring directions MR1, MR2 are placed in diagonally opposite quadrants Q1, Q3 and Q2, Q4, respectively. This may be ensured in the case of quadrants Q1, Q3 and scanning units E21, E22, E25 and E26. In this case, in opposite quadrants Q1, Q3 and Q2, Q4, respectively, particular care must be taken that no point symmetry results in the placement of the scanning units relative to center S. This demand may be satisfied, for example, by placing scanning unit E21 closer than scanning unit E25 to center S of table T.

As explained above, additional scanning units may be provided, which are used to detect table movements along the Z-axis.

Another exemplary embodiment of the position-measuring device is explained with reference to FIG. 8, in which, again only the significant differences from the first two variants are discussed below.

For example, an expanded processing tool in a corresponding machine may make it necessary to leave open a large area in the center of the grid plates. Scanning units which are located under the processing tool then supply no position values.

Because, according to this exemplary embodiment of the position-measuring device, in each case at least two scanning units E31/E32, E33/E34, E35/E36, E37/E38 are disposed in all four quadrants Q1 to Q4 of the described coordinate system, the desired position and vibration detection nevertheless remains possible. For example, if the processing tool is located over one of the four quadrants Q1 to Q4, then using the measured position values from the scanning units of the other three quadrants Q1 to Q4, measuring is still able to be performed.

The geometrical considerations mentioned above hold true with regard to this exemplary embodiment, as well. Similarly, additional scanning units may be provided.

What is claimed is:

1. A position-measuring device for detecting a relative position of two machine components movable relative to each other at least along a first main direction of motion and a second main direction of motion in a displacement plane, comprising
at least one measuring standard mountable on a first machine component; and
at least six scanning units mountable on a second machine component and adapted for optical scanning of the measuring standard in at least two measuring directions in the displacement plane;
wherein at least two scanning units are assigned to each measuring direction; and
wherein the scanning units of each respective measuring direction in the displacement plane are arranged non-centrosymmetrically in relation to a center of the second machine component.

2. The position-measuring device according to claim 1, further comprising at least three further scanning units adapted to detect the relative position of the two machine components along a further direction oriented perpendicular to the displacement plane.

3. The position-measuring device according to claim 1, wherein the scanning units having measuring directions in common in the displacement plane are not arranged on one straight connecting line in common.

4. The position-measuring device according to claim 1, wherein a Cartesian coordinate system having four quadrants is formed by two axes aligned perpendicular to one another in the displacement plane and intersecting in the center of the second machine component, and at least two scanning units having the same measuring direction are arranged in each of at least two quadrants.

5. The position-measuring device according to claim 4, wherein all of the scanning units that are arranged in diagonally opposite quadrants have the same measuring direction.

6. The position-measuring device according to claim 4, further comprising, in at least three quadrants, a further scanning unit adapted to detect the relative position of the two machine components along a further direction oriented perpendicular to the displacement plane.

7. The position-measuring device according to claim 1, wherein a Cartesian coordinate system having four quadrants is formed by two axes aligned perpendicular to one another in the displacement plane and intersecting in the center of the second machine component, and at least two scanning units, having the same measuring direction, are arranged in each of at least three quadrants.

8. The position-measuring device according to claim 7, wherein all of the scanning units that are arranged in diagonally opposite quadrants have the same measuring direction.

9. The position-measuring device according to claim 7, further comprising, in at least three quadrants, a further scanning unit adapted to detect the relative position of the two machine components along a further direction oriented perpendicular to the displacement plane.

10. The position-measuring device according to claim 1, wherein a Cartesian coordinate system having four quadrants is formed by two axes aligned perpendicular to one another in the displacement plane and intersecting in the center of the second machine component, and at least two scanning units, having the same measuring direction, are located in each of the four quadrants.

11. The position-measuring device according to claim 10, wherein all of the scanning units that are arranged in diagonally opposite quadrants have the same measuring direction.

12. The position-measuring device according to claim 10, further comprising, in at least three quadrants, a further scanning unit adapted to detect the relative position of the two machine components along a further direction oriented perpendicular to the displacement plane.

13. The position-measuring device according to claim 1, wherein a combined scanning unit includes at least one scanning unit for a measuring direction in the displacement plane is integrated together with a scanning unit for a measuring direction perpendicular to the displacement plane.

14. A method, comprising;
detecting, using the device recited in claim 1, several degrees of freedom of a movably mounted machine component;
detecting, using the device recited in claim 1, vibrations of the machine component.

15. The method according to claim 14, further comprising detecting errors of the measuring standard.

16. A method, comprising;
detecting, using the device recited in claim 1, several degrees of freedom of a movably mounted machine component and/or vibrations of the machine component.

17. The position-measuring device according to claim 1, wherein the center corresponds to a center of mass of the second machine component.

18. A system, comprising:
a first machine component;
a second machine component, the first machine component and the second machine component movable relative to each other at least along a first main direction of motion and a second main direction of motion in a displacement plane; and
a position-measuring device adapted to detect a relative position of the machine components, including:
at least one measuring standard mounted on the first machine component; and
at least six scanning units mounted on the second machine component and adapted for optical scanning of the measuring standard in at least two measuring directions in the displacement plane;
wherein at least two scanning units are assigned to each measuring direction; and
wherein the scanning units of each respective measuring direction in the displacement plane are arranged non-centrosymmetrically in relation to a center of the second machine component.

19. The system according to claim 18, wherein the center corresponds to a center of mass of the second machine component.

* * * * *